United States Patent
Kim et al.

(10) Patent No.: US 8,399,174 B2
(45) Date of Patent: Mar. 19, 2013

(54) METHOD OF FORMING FINE PATTERNS USING A BLOCK COPOLYMER

(75) Inventors: Kyoung Taek Kim, Incheon (KR); Hyun Woo Kim, Seongnam-si (KR); Sang Ouk Kim, Daejeon (KR); Shi Yong Yi, Seongnam-si (KR); Seong Woon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/236,945

(22) Filed: Sep. 20, 2011

(65) Prior Publication Data
US 2012/0003587 A1    Jan. 5, 2012

Related U.S. Application Data

(63) Continuation of application No. 12/076,491, filed on Mar. 19, 2008, now Pat. No. 8,039,196.

(30) Foreign Application Priority Data

Aug. 9, 2007    (KR) .................. 10-2007-0080325

(51) Int. Cl.
    *G03F 7/00*        (2006.01)
    *G03F 7/004*      (2006.01)
    *G03F 7/20*        (2006.01)
    *G03F 7/40*        (2006.01)

(52) U.S. Cl. .................. 430/270.1; 430/273.1; 430/311; 430/312; 430/313; 430/317; 430/322; 430/331

(58) Field of Classification Search .............. 430/270.1, 430/311, 312, 313, 317, 322, 331, 273.1
See application file for complete search history.

(56) References Cited

U.S. PATENT DOCUMENTS

| | | | |
|---|---|---|---|
| 6,746,825 B2 | 6/2004 | Nealey et al. | |
| 6,926,953 B2 * | 8/2005 | Nealey et al. | 428/220 |
| 7,387,967 B2 | 6/2008 | Ogawa et al. | |
| 7,521,094 B1 * | 4/2009 | Cheng et al. | 427/532 |
| 7,524,408 B2 | 4/2009 | Monbouquette et al. | |
| 7,560,141 B1 | 7/2009 | Kim et al. | |
| 7,579,278 B2 | 8/2009 | Sandhu | |
| 7,605,081 B2 | 10/2009 | Yang et al. | |
| 7,723,009 B2 | 5/2010 | Sandhu et al. | |
| 7,763,319 B2 * | 7/2010 | Cheng et al. | 427/256 |
| 7,790,350 B2 * | 9/2010 | Breyta et al. | 430/270.1 |

(Continued)

FOREIGN PATENT DOCUMENTS

| | | |
|---|---|---|
| JP | 2003-155365 A | 5/2003 |
| JP | 2006-215052 A | 8/2006 |

OTHER PUBLICATIONS

Black, C.T., et al., "Polymer self assembly in semiconductor microelectronics," IBM J. Res. & Dev., vol. 51, No. 5, pp. 605-633 (Sep. 2007).

(Continued)

*Primary Examiner* — Amanda C. Walke
(74) *Attorney, Agent, or Firm* — Lee & Morse, P.C.

(57) ABSTRACT

A method of patterning a substrate includes processing first regions of the substrate to form a first pattern, the first regions defining a second region between adjacent first regions, arranging a block copolymer on the first and second regions, the block copolymer including a first component and a second component, the first component of the block copolymer being aligned on the first regions, and selectively removing one of the first component and the second component of the block copolymer to form a second pattern having a pitch that is less than a pitch of a first region and an adjacent second region.

20 Claims, 9 Drawing Sheets

U.S. PATENT DOCUMENTS

2006/0134556 A1  6/2006  Nealey et al.
2009/0297778 A1  12/2009  Black et al.
2009/0308837 A1  12/2009  Albrecht et al.
2010/0092873 A1  4/2010  Sills et al.
2010/0102415 A1  4/2010  Millward et al.

OTHER PUBLICATIONS

Herr, Daniel J.C., "The Extensibility of Optical Patterning Via Directed Self-Assembly of Nano-Engineered Imaging Materials," Future-Fab Intnl., Lithography, Equipment and Materials, Section 5, (4 pages), (Jan. 12, 2005).

Kim, Gyu Man, et al., "Surface Modification with Self-Assembled Monolayers for Nanoscale Replication of Photoplastic MEMS," Journal of Microelectromechanical Systems, vol. 11, No. 3, pp. 175-181, (Jun. 2002).

Krishnamoorthy, Sivashankar, et al., "Tuning the Dimensions and Periodicities of Nanostructures Starting from the Same Polystyrene-*block*-poly(2-vinylypridine) Diblock Copolymer," Adv. Funct. Mater., 16, pp. 1469-1475, (2006).

Krishnamoorthy, Sivashankar, et al., "Block Copolymer Micelles as Switchable Templates for Nanofabrication," Langmuir, 22, pp. 3450-3452, (2006).

Speets, Emiel A., et al., "Formation of Metal Nano- and Micropatterns on Self-Assembled Monolayers by Pulsed Laser Deposition Through Nanostencils and Electroless Deposition", Adv. Funct. Mater., 16, pp. 1337-1342, (2006).

Japanese First Office Action in JP 2008-204672, dated Jan. 29, 2013 (Kim, et al.).

* cited by examiner

METHOD OF FORMING FINE PATTERNS USING A BLOCK COPOLYMER

CROSS REFERENCE TO RELATED APPLICATION

This is a continuation application based on application Ser. No. 12/076,491, filed Mar. 19, 2008 now U.S. Pat. No. 8,039,196, the entire contents of which is hereby incorporated by reference.

BACKGROUND OF THE INVENTION

1. Field of the Invention

Embodiments relate to a method of forming fine patterns using a block copolymer, in which the fine patterns may have sub-lithographic dimensions.

2. Description of the Related Art

Continuing development of nanoscale devices such as semiconductors, microelectromechanical system (MEMS) devices, DNA arrays, optical devices, etc., requires advances in fabrication techniques to enable the formation of patterns having extremely small dimensions. To date, optical lithography has been extensively relied upon to manufacture devices. Continuing development of optical lithography, however, has become increasingly difficult and expensive. Accordingly, there is a need for fabrication techniques that can leverage optical lithography techniques to produce patterns having reduced dimensions.

SUMMARY OF THE INVENTION

Embodiments are therefore directed to a method of forming fine patterns using a block copolymer, which substantially overcomes one or more of the problems due to the limitations and disadvantages of the related art.

It is therefore a feature of an embodiment to provide a method of forming patterns having sub-lithographic dimensions.

It is therefore another feature of an embodiment to provide a method of forming a feature having a dimension corresponding to a width of a pattern formed by microphase separation of a block copolymer.

At least one of the above and other features and advantages may be realized by providing a method of patterning a substrate, including processing first regions of the substrate to form a first pattern, the first regions defining a second region between adjacent first regions, arranging a block copolymer on the first and second regions, the block copolymer including a first component and a second component, the first component of the block copolymer being aligned on the first regions, wherein the first component of the block copolymer has a first affinity for the first regions and the second component of the block copolymer has a second affinity for the first regions, the first affinity being higher than the second affinity, adjacent first regions are covered by the first component, two distinct portions of the second region are covered by the second component, and a third portion of the second region is covered by the first component, the third portion being between the two distinct portions, and selectively removing one of the first component and the second component of the block copolymer to form a second pattern having a pitch that is less than a pitch of a first region and an adjacent second region.

The pitch of the second pattern may be an integer fraction of the pitch of a first region and an adjacent second region. The integer fraction may be ½, ⅓, ¼, ⅕, ⅙, ⅐, ⅛, or ⅑. The substrate may include a target material layer, an anti-reflective layer on the target material layer, and an image layer on the anti-reflective layer, and the first and second regions may be part of the image layer. The method may include selectively removing the first component, and the method may further include etching the substrate using the second component as an etch mask after selectively removing the first component. Etching the substrate using the second component as an etch mask may result in a recess being formed in the substrate in a position corresponding to the third portion of the second region. The block copolymer may be a diblock copolymer.

At least one of the above and other features and advantages may also be realized by providing a method of patterning a substrate, including modifying at least two first regions of the substrate to have a predetermined affinity for a first component of a block copolymer, the at least two first regions having a second region therebetween, determining a size of at least two features to be formed on the substrate between the first regions, determining a volume ratio of the first component so that the first component covers the first regions, determining a volume ratio of a second component of the block copolymer so that the second component covers at least two portions of a second region of the substrate and exposes a third portion of the second region between the at least two portions, the two at least two portions each having a size corresponding to the size of the feature, arranging the block copolymer on the first and second regions such that the first component is on the first regions, the first component is on the third portion of the second region, and the second component is on the at least two portions of the second region, electively removing the first component so as to leave the second component on the at least two portions of the second region, and removing the first regions of the substrate and the third portion of the second region so as to form the at least two features in relief under the second component.

Each of the at least two features may have a width less than that of the second region. A combined width of the third portion and one of the at least two portions of the second region may be an integer fraction of a combined width of one of the first regions and the second region. The integer fraction may be ½, ⅓, ¼, ⅕, ⅙, ⅐, ⅛, or ⅑. The substrate may include a target material layer, an anti-reflective layer on the target material layer, and an image layer on the anti-reflective layer, and the first and second regions may be part of the image layer. The at least two features may be formed from the target material layer. The at least two features may be spaced apart by a recess, the recess corresponding to the third portion of the second region. The block copolymer may be a diblock copolymer. Determining the volume ratio of the first component may include determining a width of a pattern formed by microphase separation of the block copolymer.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Figure 1:
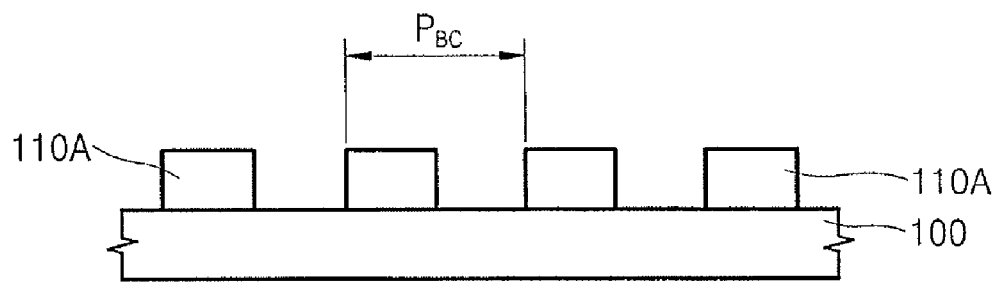
FIG. 1 illustrates a pattern formed according to an embodiment.

Korean Patent Application No. 10-2007-0080325, filed on Aug. 9, 2007, in the Korean Intellectual Property Office, and entitled: "Method of Forming Fine Pattern using Block Copolymer," is incorporated by reference herein in its entirety.

Embodiments will now be described more fully hereinafter with reference to the accompanying drawings; however, they should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Where an element is described as being connected to a second element, the element may be directly connected to second element, or may be indirectly connected to second element via one or more other elements. Further, where an element is described as being connected to a second element, it will be understood that the elements may be electrically connected, e.g., in the case of transistors, capacitors, power supplies, nodes, etc. In the figures, the dimensions of regions may be exaggerated and elements may be omitted for clarity of illustration. Like reference numerals refer to like elements throughout.

FIG. 1 illustrates a pattern formed according to an embodiment, wherein the pattern includes structures 110A and has a pitch $P_{BC}$. Referring to FIG. 1, a substrate 100 may have a pattern of the structures 110A formed thereon. The structures 110A may have the pitch $P_{BC}$, i.e., a distance from a first edge of one structure 110A to a corresponding first edge of an adjacent structure 110A may be equal to $P_{BC}$. The structures 110A may expose regions of the substrate 100.

As described in detail herein, the pitch $P_{BC}$ may be less than a pitch of a lithographic pattern. For example, referring to FIG. 1, the pitch of the lithographic pattern may be two times (2×) the pitch $P_{BC}$. In another example (not shown in FIG. 1), the pitch of the lithographic pattern may be, e.g., three, four, five, etc., times the pitch $P_{BC}$.

Figure 2A:
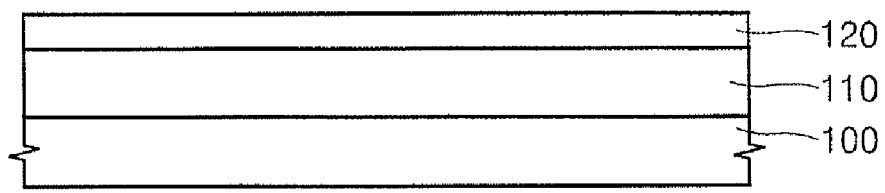
FIGS. 2A-2K illustrate stages in a method of forming the pattern illustrated in FIG. 1.
Figure 2B:
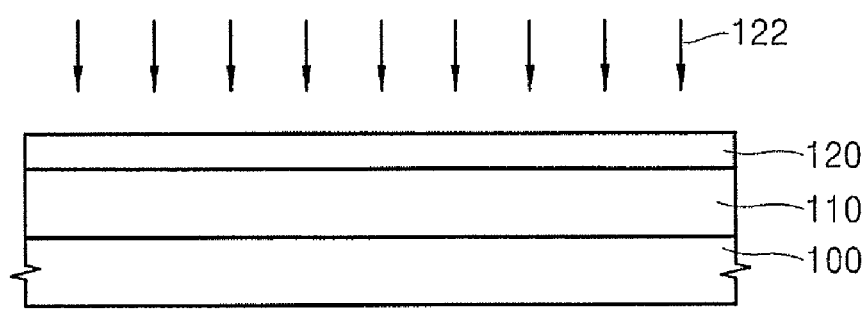

FIGS. 2A-2K illustrate stages in a method of forming the structures 110A. Referring to FIG. 2A, the substrate 100 may have a target layer 110 formed thereon. The target layer 110 may be a layer that is processed to form the structures 110A. The target layer 110 may be, e.g., an insulating layer such as silicon oxide, silicon nitride, silicon oxynitride, etc., a metal layer such as gold, platinum, copper, etc., or any other suitable material or combination of materials. In another implementation, the substrate 100 itself may be processed to form patterns therein, in which case the target layer 110 may be omitted.

In an implementation, an anti-reflective layer 120 may be formed on the target layer 110. The anti-reflective layer 120 may include silicon, e.g., silicon and oxygen in a ratio of $SiO_{3/2}$. When the anti-reflective layer 120 includes silicon, the anti-reflective layer 120 may be treated to expose silanol groups, i.e., Si—OH groups, on the surface thereof, as indicated by arrows 122 in FIG. 2B. Treating the anti-reflective layer 120 may include, e.g., treating the surface thereof with an alkaline solution, i.e., a solution having a pH of less than 7, treating the surface with HF, etc. Similarly, when the anti-reflective layer 120 is omitted and the target layer 110 includes silicon, the target layer 110 may be surface treated using the alkaline solution, HF, etc. Also, when the anti-reflective layer 120 and the target layer 110 are omitted, and the substrate 100 includes silicon, the substrate 100 may be surface treated using the alkaline solution, HF, etc. When the target film 110 is a metal layer, surface treatment may be omitted.

Figure 2C:
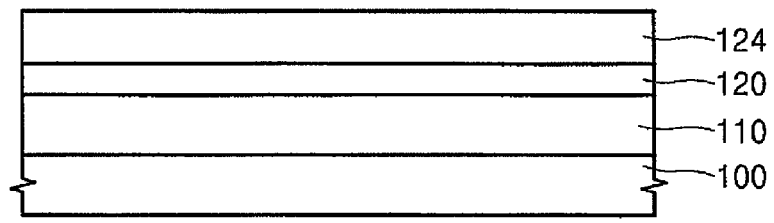

Referring to FIG. 2C, an image layer 124 may be formed on the previously-formed layer, e.g., on the anti-reflective layer 120. The image layer 124 may exhibit an affinity for a first component of a subsequently-formed pattern-forming material layer 140, which is shown in FIG. 2G and described in detail below. The affinity exhibited by the image layer 124 towards the first component may be modifiable, e.g., through application of deep UV light, soft x-rays, electron beams, oxygen plasma, etc., so as to change the degree of affinity of the image layer 124 with respect to the first component of the pattern-forming material layer 140. The affinity of the image layer 124 for the first component of the pattern-forming material layer 140 may assist in inducing an ordered structure in the pattern-forming material layer 140, as described below in greater detail in connection with the description of the pattern-forming material layer 140.

The image layer 124 may be fixed to the underlying layer, e.g., the anti-reflective layer 120, via functional groups of the image layer 124 and/or the underlying layer. The image layer 124 may include, e.g., a silane having an organic substituent, a silazane having a organic substituent, a polymer having a terminal chlorosilane group, an organic compound having a COBr functional group, an organic compound having a thiol group, an organic compound having disulfide(-S—S—) bond, etc. For example, the image layer 124 may include one or more of R1-SiCl$_3$, (R2)$_3$-SiCl, (R3)$_3$-SiH, (R4)Si(OCH$_2$CH$_3$)$_3$, (R5)Si(OCH$_3$)$_3$, (R6)-SH, (R7)-S—S-(R8), etc., in which R1 through R8 may be, independently, hydrocarbon groups having from 1 to about 20 carbons (C1 to C20), may be unsubstituted or substituted, and may be saturated or unsaturated, e.g., aromatic.

In an implementation, the image layer 124 may include a homopolymer having a terminal trichlorosilane group or a random polymer having a terminal trichlorosilane group. For example, the image layer 124 may include a homopolymer such as polystyrene having a terminal trichlorosilane group, polyhydroxystyrene having a terminal trichlorosilane group, polymethylmethacrylate having a terminal trichlorosilane group, etc., or a random polymer such as polyhydroxystyrene-polymethylmethacrylate having a terminal trichlorosilane group.

In another implementation, the image layer 124 may include a self-assembled monolayer. The self-assembled monolayer may be formed by, e.g., reacting chlorosilane with hydroxyl (—OH) functional groups exposed on a silicon-containing underlayer, e.g., layer 100, 110, or 120, so as to form a Si—O—Si bond, thereby forming a self-assembled monolayer on the underlayer. The exposed hydroxyl functional groups may be generated by treating the surface of the underlayer with an alkaline solution, HF, etc., as described above. The self-assembled monolayer may be covalently bound to the underlying layer. In another example, the self-assembled monolayer may be formed from organic compounds having an anchoring group, e.g., a thiol group or silane group, or organic compounds having a disulfide bond (—S—S—). The use of such anchoring groups may be well-suited to forming a self-assembled monolayer on a gold underlayer.

Figure 2D:
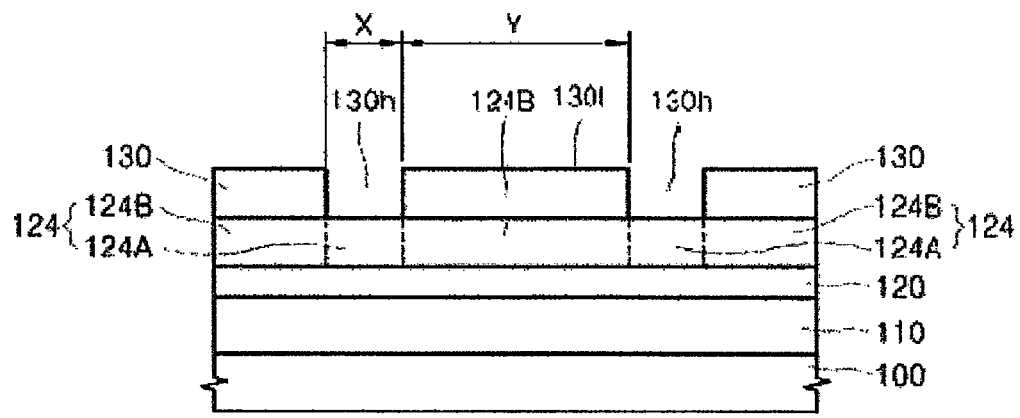

Referring to FIG. 2D, an imaging layer 130, e.g., a positive or negative photoresist layer, may be formed on the image layer 124. The imaging layer 130 may be processed to form a first pattern therein using an appropriate imaging technique, e.g., a standard lithographic technique including exposure to light through a mask and developing. In particular, the imaging layer 130 may be processed to form a patterned imaging layer 130 having openings 130h and lands 130l therein. Dimensions X and Y of the openings 130h and lands 130l, respectively, may have a particular relationship to a feature to be formed, e.g., the structures 110A, as well as a particular relationship to a component of the pattern-forming material layer 140. Details of these relationships will be described below in greater detail in connection with the description of the pattern-forming material layer 140.

Figure 2E:
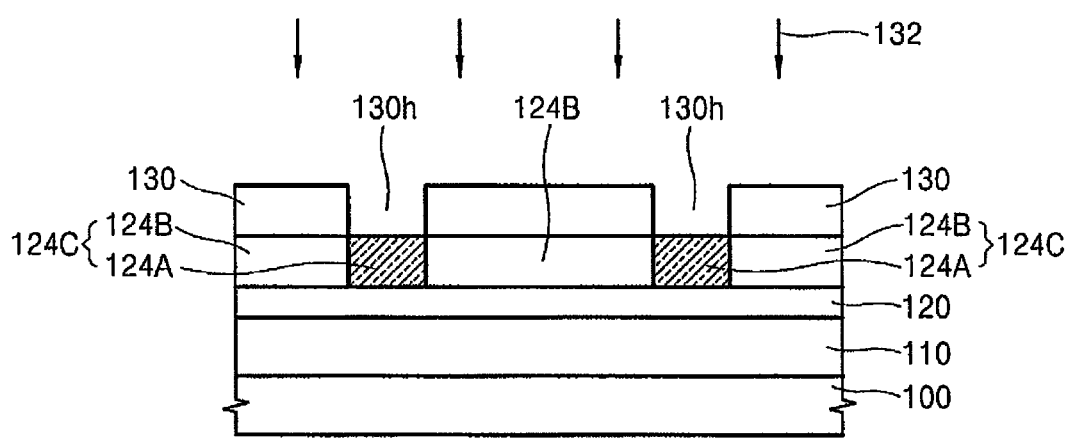

Referring to FIGS. 2D and 2E, the patterned imaging layer 130 may be used as a mask during a process that modifies the affinity of the image layer 124 in selected regions. The affinity exhibited by the image layer 124 for the first component of the pattern-forming material layer 140 may be modified, e.g., through application of an external impetus 132 such as deep UV light, soft x-rays, electron beams, oxygen plasma, etc., in exposed first regions 124A that correspond to the openings 130h in the patterned imaging layer 130. The degree of affinity of the first regions 124A for the first component of the pattern-forming material layer 140 may be increased or decreased in the first regions 124A, as compared to the affinity exhibited by the unmodified second regions 124B.

Referring to FIG. 2E, the modification of the affinity of the image layer 124 in the first regions 124A may include, e.g., modifying the hydrophilicity of the first regions 124A. For example, the first regions 124A may be oxidized, e.g., at the surface only or through the entire thickness of the image layer 124, so as to make the first regions 124A more hydrophilic where they are oxidized. Thus, the first regions 124A may be modified to be more hydrophilic than the second regions 124B. Additionally, the surface energy of the first regions 124A may be modified, such that a contact angle of a material applied on the first regions 124A may be modified. For example, the external impetus 132, e.g., oxygen plasma treatment, may be used to modify the surface energy of the first regions 124A and enhance wettability with respect to polar groups of the material applied on the first regions 124A.

Figure 2F:
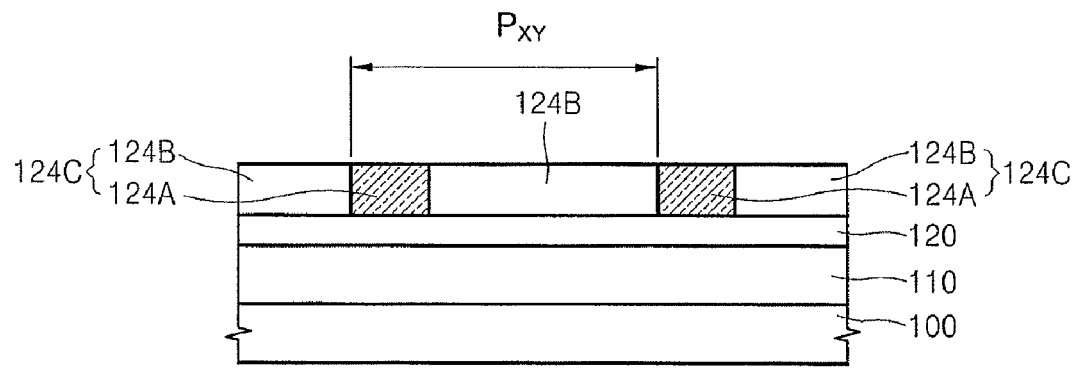
Figure 2G:
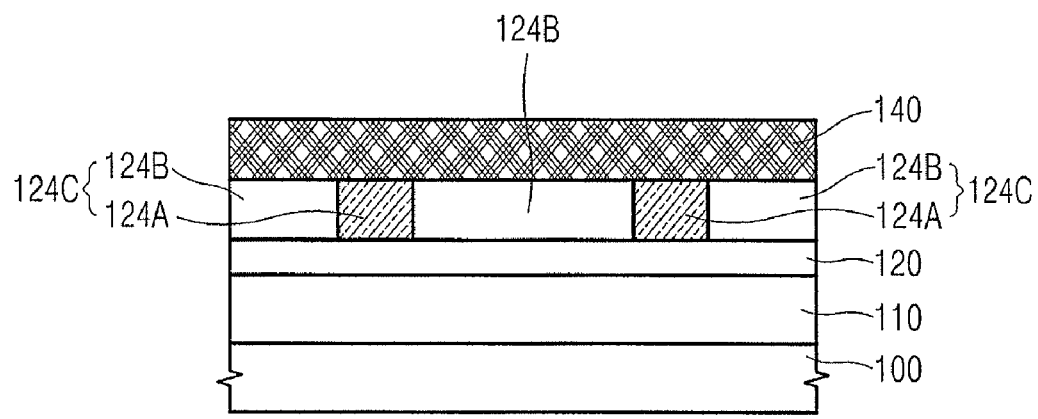

Referring to FIG. 2F, after modifying the affinity of the image layer 124, the patterned imaging layer 130 may be removed. Removal of the patterned imaging layer 130 may be effected in a manner that does not eliminate the differences in affinities exhibited by the first and second regions 124A and 124B. After removal of the patterned imaging layer 130, the substrate 100 may have a second pattern 124C of the first and second regions 124A and 124B, the second pattern having a pitch $P_{XY}$. The second pattern 124C may include one or more second regions 124B and two or more first regions 124A. The second pattern 124C may be regular, i.e., repeating, or irregular. One second region 124B may be bounded by two adjacent first regions 124A. The dimension represented by the pitch $P_{XY}$ may equal a dimension of one entire first region 124A plus one entire second region 124B.

Figure 6:
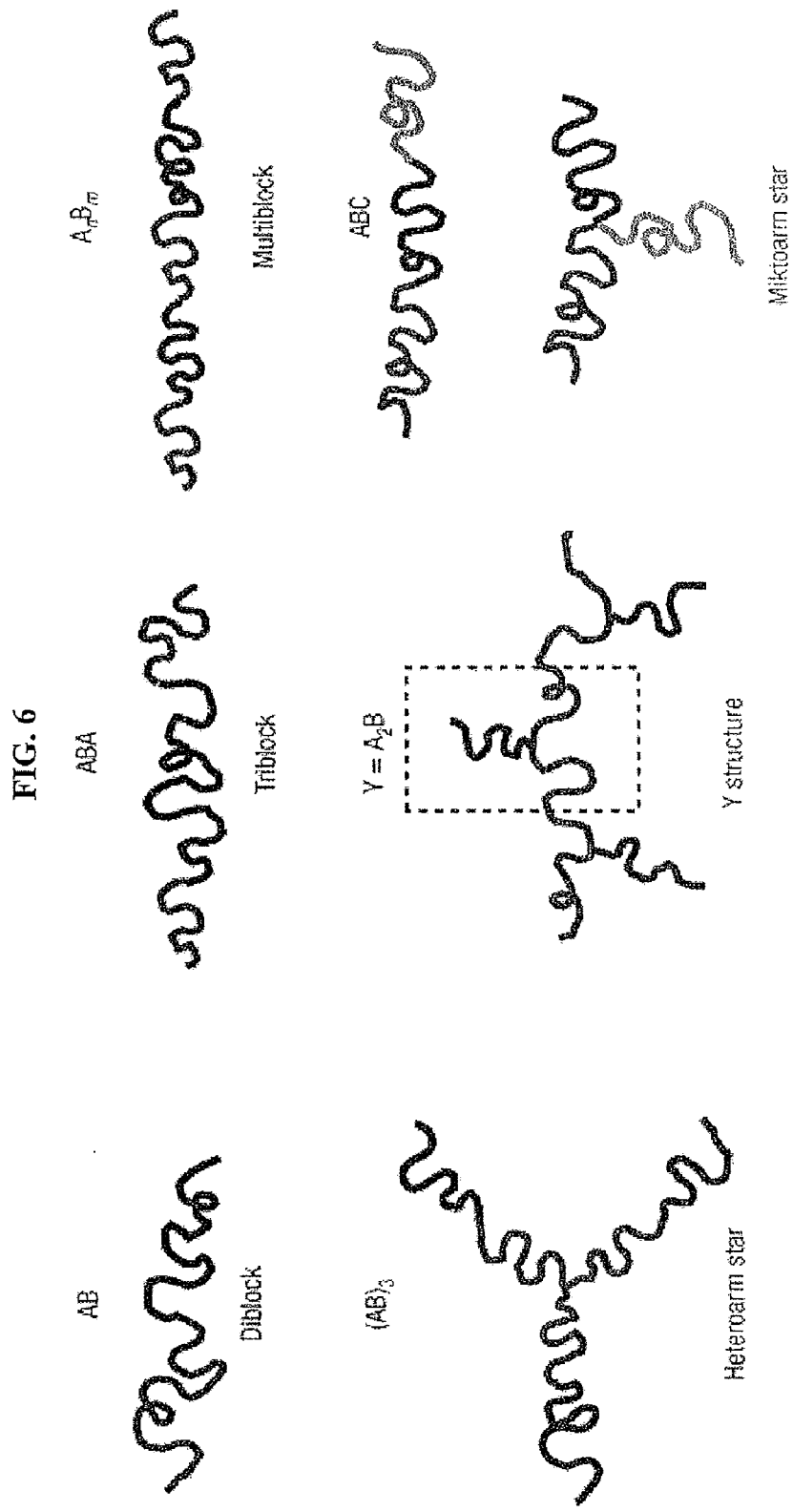
FIG. 6 illustrates structures formed through microphase separation of block copolymers.

Referring to FIG. 2G, the pattern-forming material layer 140 may be formed on the first and second regions 124A and 124B. The pattern-forming material layer may include a block copolymer having first and second components that are covalently bound. For example, the first component may be a first polymer and the second component may be a second polymer that is covalently bound to the first component in a diblock copolymer, as illustrated in FIG. 6. The structure of a diblock copolymer AB may correspond, for example, to AAAAAAA-BBBBBBB. In another implementation, the first and second components may be part of a triblock copolymer that further includes a third component, and higher-order multiblock copolymers may also be used. In the description that follows, the diblock copolymer will be used as a specific example.

The two blocks, i.e., two components, of the block copolymer may have the same or different molecular weights and may have the same or different volume ratio. In an implementation, the volume ratio of each component may be approximately the same. The block copolymer may be a diblock copolymer such as polystyrene-polymethylmethacrylate, polybutadiene-polybutylmethacrylate, polybutadiene-polydimethylsiloxane, polybutadiene-polymethylmethacrylate, polybutadiene-polyvinylpyridine, polybutylacrylate-polymethylmethacrylate, polybutylacrylate-polyvinylpyridine, polyisoprene-polyvinylpyridine, polyisoprene-polymethylmethacrylate, polyhexylacrylate-polyvinylpyridine, polyisobutylene-polybutylmethacrylate, polyisobutylene-polymethylmethacrylate, polyisobutylene-polybutylmethacrylate, polyisobutylene-polydimethylsiloxane, polybutylmethacrylate-polybutylacrylate, polyethylethylene-polymethylmethacrylate, polystyrene-polybutylmethacrylate, polystyrene-polybutadiene, polystyrene-polyisoprene, polystyrene-polydimethylsiloxane, polystyrene-polyvinylpyridine, polyethylethylene-polyvinylpyridine, polyethylene-polyvinylpyridine, polyvinylpyridine-polymethylmethacrylate, polyethyleneoxide-polyisoprene, polyethyleneoxide-polybutadiene, polyethyleneoxide-polystyrene, polyethyleneoxide-polymethylmethacrylate, polyethyleneoxide-polydimethylsiloxane, etc.

In an implementation, the block copolymer may be mixed with one or more homopolymers, i.e., one or more polymers that are intermixed with, but not covalently bound to, the block copolymer. As used herein, a homopolymer means a polymer of one type of repeating monomer unit. The homopolymer mixed with the block copolymer may have a chemical structure identical to that of a repeating monomer unit of one polymer block of the block copolymer. Further, two different homopolymers may be mixed with the block copolymer, each homopolymer having a chemical structure identical to one of the blocks of the block copolymer.

Figure 2H:
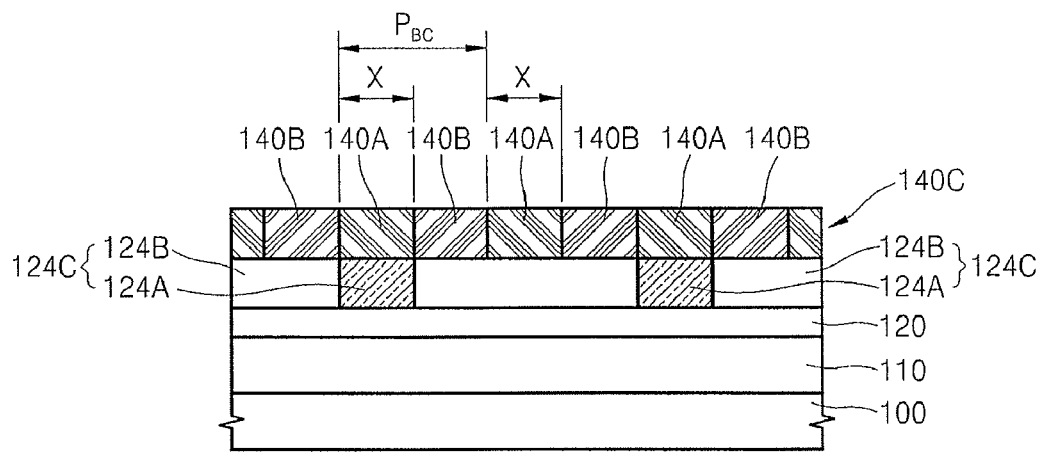

Referring to FIG. 2H, one of the components, e.g., the first component, may have a higher affinity for the first regions 124A. The pattern-forming material layer 140 may be formed on the first and second regions 124A and 124B, and a microphase separation may be induced in the pattern-forming material layer 140 whereby the block copolymer self-assembles into an ordered structure that is registered with the second pattern 124C. For example, the block copolymer may undergo microphase separation and self-assemble into a lamellar structure in which one block, e.g., the first component 140A, is aligned with the first regions 124A.

The microphase separation may result in lamellar structures, cylindrical structures, spherical structures, gyroid structures, etc. Microphase separation results from minimizing interfacial energy between two (or more) immiscible polymer blocks, and may be affected by the block ratio (volume fraction) of the blocks of the copolymer, which is influenced by the molecular weights of the blocks that make up the block copolymer. The interfacial energy may also be affected by the Flory-Huggins interaction parameter chi (χ), the number of monomer units in each component of the block copolymer, the energy of mixing the blocks, which is inversely proportional to temperature, and the dimension of each segment of the block copolymer. Additional details of these factors and other aspects of the microphase separation and self-assembly of the block copolymer are described in U.S. Pat. No. 6,746,825 and U.S. Patent Application Publication No. 2006/0134556 A1, which are hereby incorporated by reference in their entirety and for all purposes.

Inducing the microphase separation may include an annealing operation. The annealing operation may be effected by elevating the temperature of the pattern-forming material layer 140 to a temperature above the glass transition temperature, e.g., to a temperature of about 130° C. to about 190° C., and maintaining the elevated temperature for a period of time, e.g., about 1 hour to about 24 hours.

During the microphase separation, the components of the block copolymer may align with the underlying layer in accordance with their respective affinities therefor. For example, referring to FIG. 2H, the first component 140A may have a higher affinity for the first region 124A than for the second region 124B, and may thus align with the first region 124A to form a self-assembled pattern 140C. In an implementation, the first component 140A may be polar, and the first region 124A may be more hydrophilic than the second region 124B.

The chemical structure of the block copolymer may be predetermined, e.g., in terms of the respective hydrophilicity and molecular weight of the first and second components, i.e., blocks, such that the self-assembled copolymer structure aligns with the second pattern in a predetermined fashion. The self-assembled copolymer structure may form a regular repeating pattern of first components 140A and second components 140B, the block copolymer pattern having a pitch $P_{BC}$. The pitch $P_{BC}$ may be an integer fraction, e.g., ½, ⅓, ¼, etc., of the pitch $P_{XY}$. That is, the sum of the dimensions X and Y of the openings 130h and lands 130l may be an integer multiple of the pitch $P_{BC}$. Referring to FIG. 2H, the self-assembled copolymer structure produced by the microphase separation of the block copolymer may satisfy relationship R1 below. In relationship R1, $P_{XY}$ is as defined above ($P_{XY}=X+Y$) and n is a positive integer:

$$P_{XY}=P_{BC}*(n+1) \tag{R1}$$

The value of n may depend on the type of components making up the blocks of the copolymer and the molecular weights of polymer blocks. It will be appreciated that either the pitch $P_{XY}$, the pitch $P_{BC}$, or both, may be controlled to satisfy relationship R1. For example, the type of components and/or molecular weights of the block copolymer may be determined in advance based on the pitch $P_{XY}$. Conversely, the pitch $P_{XY}$, i.e., the dimensions X and Y, may be determined in advance based on the type of components and/or molecular weights of the block copolymer, i.e., on the pitch $P_{BC}$.

As can be seen from relationship R1, the pitch $P_{BC}$ of the pattern formed by the self-assembled copolymer structure may be less than the pitch $P_{XY}$. By selectively removing one of the components of the copolymer, a pattern of openings defined by the remaining component may be formed with a pitch that is less than the pitch of the originally-formed lithographic pattern (see FIG. 2D). Thus, selective removal of one of the components may result in openings having sub-lithographic sizes, thereby enabling the formation of sub-lithographic features using existing lithographic techniques.

Figure 2I:
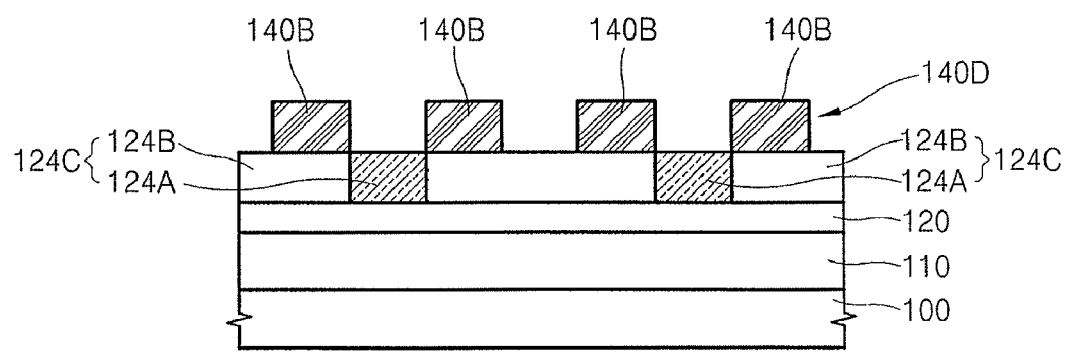

Referring to FIG. 2I, one of the components of the block copolymer, e.g., the first component 140A, may be selectively removed to form a pattern 140D having a sub-lithographic pattern of openings, the openings corresponding to the locations of the removed first components 140A above the first regions 124A. In the case that the block copolymer is a diblock copolymer, the openings may be bounded by remaining second components 140B on each side of the openings, as shown in FIG. 2I.

Selective removal of one of the components of the block copolymer may be effected using a technique appropriate to the chemical composition of the block copolymer. For example, one of the components may be chemically degraded through application of an external impetus to which the second component is largely resistant. For example, when a polymethylmethacrylate-containing block copolymer is used, e.g., a polystyrene-polymethylmethacrylate diblock copolymer shown below in structure S1:

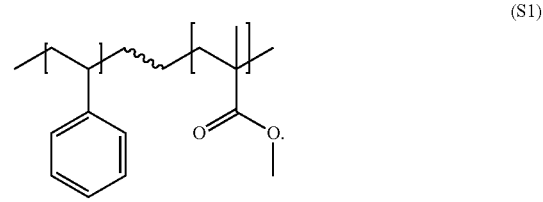

(S1)

In structure S1, the polymethylmethacrylate component may be selectively decomposed and removed through exposure of the block copolymer to UV light, followed by developing, e.g., immersion in an acetic acid solution. As a result, a pattern of openings bounded by the remaining polystyrene component may be formed.

Figure 2J:
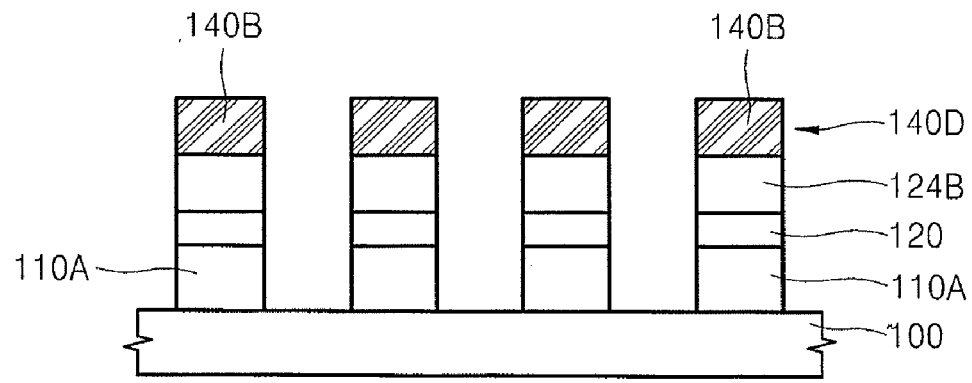
Figure 2K:
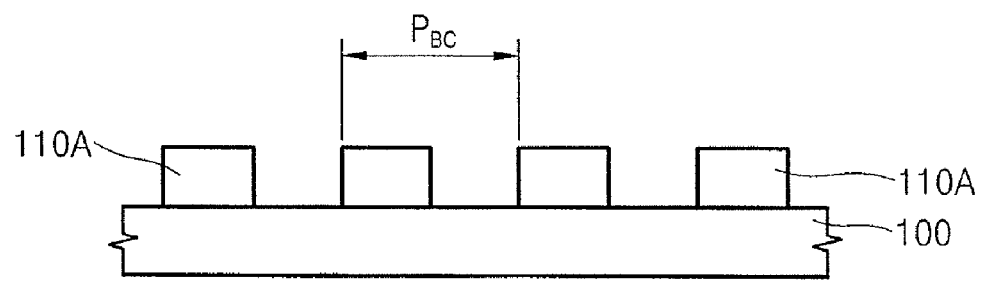

Referring to FIG. 2J, the pattern 140D resulting from the selective removal of the first component 140A of the block copolymer may be used as an etch mask to selectively etch one or more of the underlying layers. For example, an etching process may be performed to etch the first regions 124A, the anti-reflective layer 120, and the target layer 110. The etching of the target layer 110 may leave a pattern of the structures 110A underlying the second components 140B. Referring to FIG. 2K, the layers overlying the structures 110A may then be removed. The structures 110A may remain on the substrate 100, and the pattern of structures 110A and adjacent openings may have dimensions corresponding to the pitch $P_{BC}$ of the self-assembled block copolymer pattern.

It is noted that the process illustrated in FIGS. 2A-2K uses a diblock copolymer as an example, the diblock copolymer having first and second components each with approximately the same or similar volume ratio (hereinafter, referred as "a 50-50 diblock copolymer"), and the process selectively removes the first component 140A. Accordingly, in this example, the dimension X of the first pattern, which corresponds to the width of the first regions 124A, and thus, corresponds the width of the portion of the self-assembled block copolymer structure made up by the first components 140A, may be the same as the width of the structure 110A that is formed under the second components 140B. It will be appreciated, however, that the block copolymer may be other than the 50-50 diblock copolymer. For example, a 75-25 diblock copolymer having an about 75:25 volume ratio may be used, in which the first component has a volume ratio that is about three times (3×) greater than that of the second component.

It is also noted that the process illustrated in FIGS. 2A-2K uses n=1 as an example and, as shown in FIGS. 2I-2J, two structures 110A are formed in the space between adjacent first regions 124A. However, n may be greater than 1, e.g., 2, 3, or more. Referring to FIGS. 3A-3D, a case where n=3 is illustrated. The processes illustrated in FIGS. 3A-3D generally correspond to those described above in connection with FIGS. 2A-2K, and details thereof may be omitted to avoid repetition.

Figure 3A:
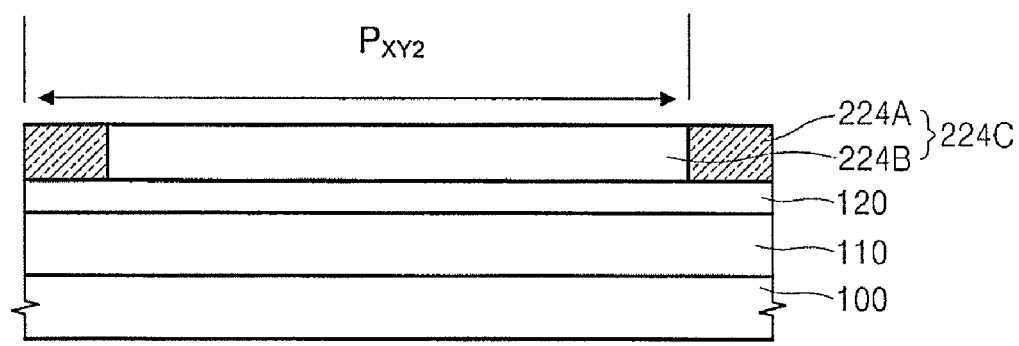
FIGS. 3A-3D illustrate stages in a method of forming a pattern according to another embodiment.
Figure 3B:
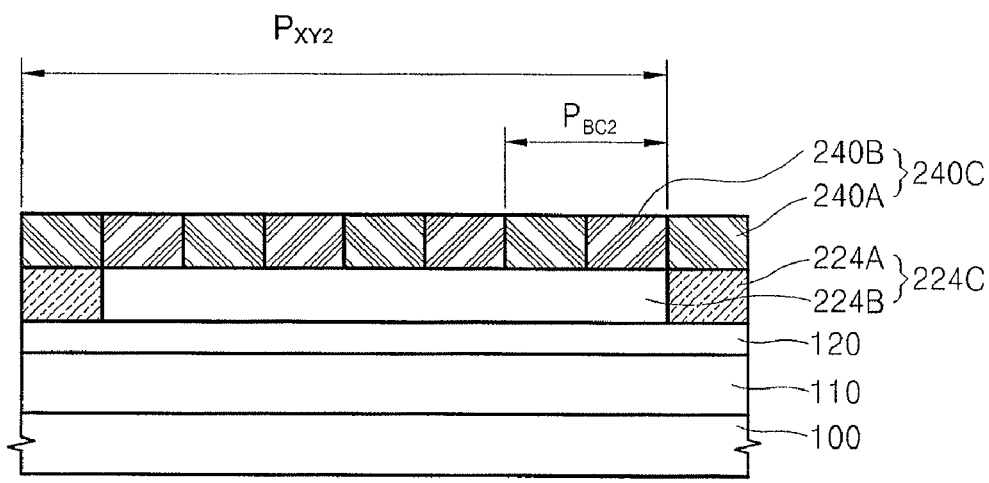
Figure 3C:
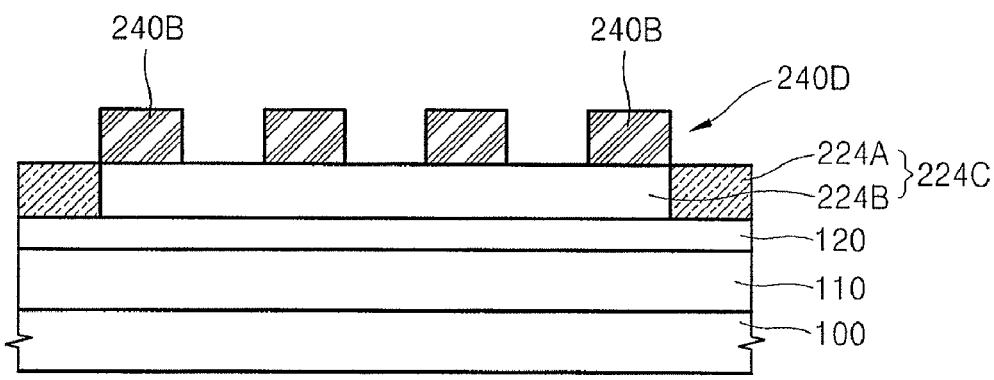
Figure 3D:
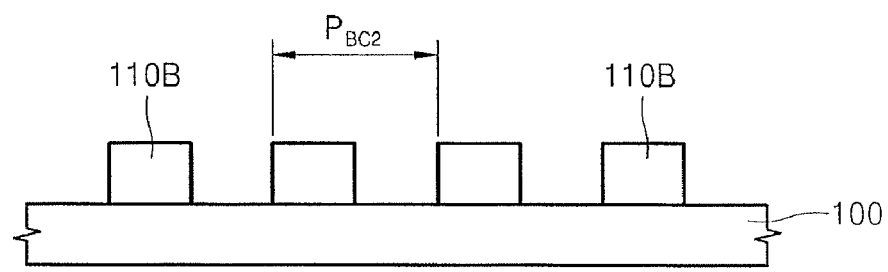

Referring to FIG. 3A, a first pattern 224C having regions 224A and 224B may be formed from an image layer corresponding to the image layer 124 shown in FIG. 2C, each pair of regions 224A and 224B having a pitch $P_{XY2}$. Referring to FIG. 3B, a second pattern 240C of first and second components 240A and 240B of a self-assembled copolymer may have a pitch $P_{BC2}$ that is ¼ of the pitch $P_{XY2}$ (n+1=4). Referring to FIG. 3C, the first components 240A may be selectively removed to form a third pattern 240D. Referring to FIG. 3C, the second components 240B that remain after removal of the first components 240A may be used as an etch mask to pattern the target layer 110. After patterning the target layer 110, the overlying layers may be removed to yield structures 110B on the substrate 100, with four structures 110B formed in the space between adjacent first regions 224A, as shown in FIG. 3D.

Figure 4:
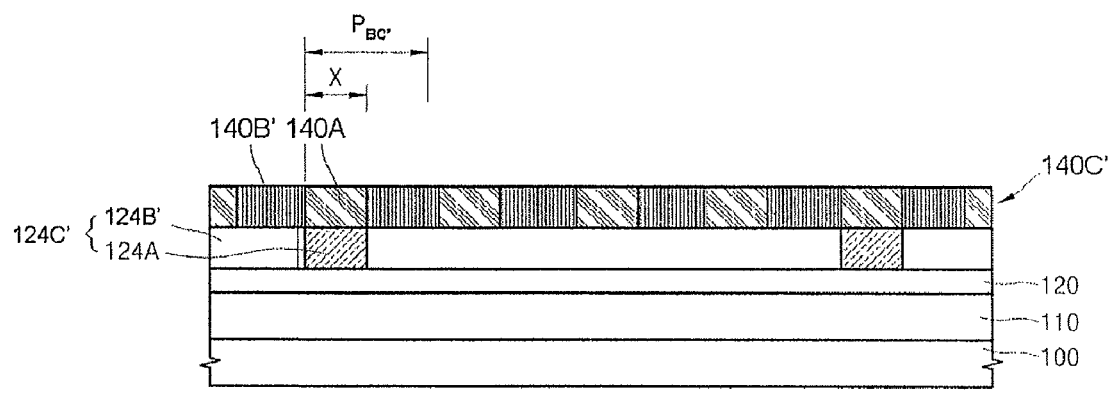
FIG. 4 illustrates a pattern formed using a block copolymer admixed with a homopolymer.

FIG. 4 illustrates a pattern formed using a block copolymer admixed with a homopolymer. In an implementation, the homopolymer may be soluble in, and have an affinity for, the second component 140B. Accordingly, the first component 140A may remain largely unchanged, while the second component 140B and the homopolymer form a mixture 140B'. Thus, a self-assembled pattern 140C' may include the first component 140A and the second component and homopolymer mixture 140B'. The inclusion of the homopolymer in the mixture 140B' may result in the mixture 140B' occupying a greater area than the second component 140B illustrated in FIG. 2H. Thus, a pitch $P_{BC}'$ of the pattern illustrated in FIG. 4 may be greater than the pitch $P_{BC}$ of the pattern illustrated in FIG. 2H. In an implementation, the dimension of a second region 124B' may be greater than that of the second region 124B described above, so as to correspond to the greater area occupied by the mixture 140B'. A second pattern 124C' may include the first region 124A and the second region 124B'.

Factors such as the pitch $P_{XY}$, each of the dimensions X and Y, and time duration for self-assembling of the block copolymer may vary according to whether the block copolymer is mixed with one or more homopolymers. For example, the inclusion of homopolymers may widen the dimensions X and Y according to the types of the homopolymers, and may increase the time required for self-assembly of the block copolymer.

Figure 5:
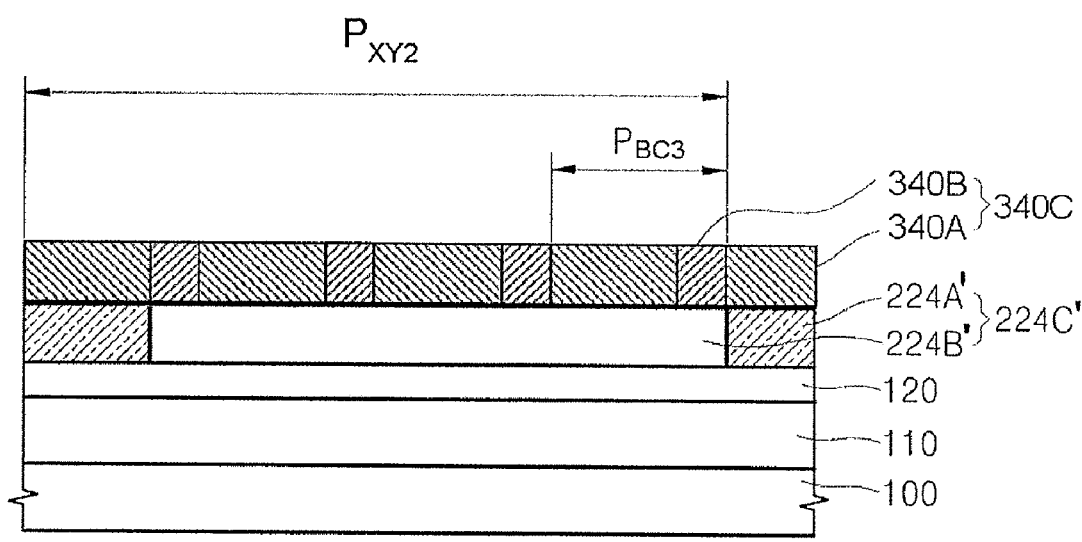
FIG. 5 illustrates a pattern formed using a 75-25 diblock copolymer.

FIG. 5 illustrates a pattern formed using a 75-25 diblock copolymer for a case in which n=3. Referring to FIG. 5, a pitch $P_{XY2}$ may be four times a dimension of a pitch $P_{BC3}$. Thus, referring again to FIG. 3B, the pitch $P_{BC3}$ may be the same as the pitch $P_{BC2}$. In contrast to the pattern 240C, however, a pattern 340C may be formed in which a first component 340A has a volume fraction that is three times that of a second component 340B. In an implementation, the dimension of a first region 224A' may be greater than that of the second region 224A described above in connection with FIG. 3B, so as to correspond to the greater area occupied by the greater volume fraction of the second component 340A. A second pattern 224C' may include the first region 224A' and a second region 224B'.

The limit for n may depend on one or more factors including, e.g., the degree of affinity between the block copolymer and the underlying layer, the nature of the polymer blocks that make up the block copolymer, the inclusion of homopolymers or other materials in the pattern-forming material layer, etc., as well as more practical concerns such as the amount of time available for allowing the block copolymer to self-assemble. When n is too large, the ordering effect of the first regions 124A on the self-assembled block copolymer may not be low and defects in the self-assembled structure may result. Generally, n may be from 1 to about 8.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a pattern on a substrate using a block copolymer that includes a first component and a second component, the method comprising:

changing a degree of affinity of first regions of an image layer on the substrate by a chemical treatment with respect to the first component such that the first component of the block copolymer has a first affinity with respect to the first regions and the second component of the block copolymer has a second affinity with respect to the first regions, the first component having a higher affinity for the first regions than for second regions of the image layer;

arranging the block copolymer on the first regions and the second regions of the image layer such that the first regions have the first component thereon, and the second regions have the first and second components thereon; and removing the first component from the first regions and the second regions such that the second regions are partially covered by the second component, and are partially exposed where the first component is removed from second regions.

2. The method as claimed in claim 1, wherein the first affinity is higher than the second affinity.

3. The method as claimed in claim 1, wherein the first regions define a second region between adjacent first regions.

4. The method as claimed in claim 3, wherein the first regions are covered by the first component, and two distinct portions of the second region are covered by the second component, the two distinct portions being separated by a third portion.

5. The method as claimed in claim 1, wherein a first pattern is formed by changing of the degree of affinity of the first regions, and a second pattern is formed by selectively removing one of the first component and the second component of the block copolymer.

6. The method as claimed in claim 5, wherein a pitch of the second pattern is less than a pitch of the first pattern.

7. The method as claimed in claim 6, wherein the pitch of the second pattern is an integer fraction of the pitch of the first region.

8. The method as claimed in claim 7, wherein the integer fraction is ½, ⅓, ¼, ⅕, ⅙, ⅐, ⅛, or ⅑.

9. A method of forming a pattern on a substrate using a block copolymer that includes a first component and a second component, the method comprising:

differentiating a degree of affinity between a first region and a second region of an image layer with respect to the first component of the block copolymer such that the first component of the block copolymer has a first affinity with respect to the first region and the second component of the block copolymer has a second affinity with respect to the first region, the first affinity being different from the second affinity;

arranging the block copolymer only on the image layer such that the first region has the first component thereon, and the second region has the first and second components thereon; and removing the first component from the first region and the second region such that the second region is partially covered by the second component, and is partially exposed where the first component is removed from second region.

10. The method as claimed in claim 9, wherein the first affinity is higher than the second affinity.

11. The method as claimed in claim 9, wherein two distinct portions of the second region are covered by the second component, and a third portion of the second region is covered by the first component, the third portion being between the two distinct portions.

12. The method as claimed in claim 9, wherein a thickness of the first region of the image layer is substantially the same as a thickness of the second region of the image layer.

13. The method as claimed in claim 9, wherein the differentiating of the degree of affinity is performed by chemical treatment, the chemical treatment comprising application of UV light, soft x-rays, electron beams, or oxygen plasma.

14. A method of forming a pattern on a substrate using a block copolymer that includes a first component and a second component, the method comprising:

changing a degree of affinity of first regions of an image layer on the substrate by a chemical treatment with respect to the first component of the block copolymer such that the first component of the block copolymer has a first affinity with respect to the first regions and the second component of the block copolymer has a second affinity with respect to the first regions, the first component having a higher affinity for the first regions than for second regions of the image layer;

determining a volume fraction of the first component so that the first component covers the first regions;

arranging the block copolymer on the first and the second regions of the image layer such that the first regions have the first component thereon, and the second regions have the first and second components thereon; and removing the first component from the first regions and the second regions such that the second regions are partially covered by the second component, and are partially exposed where the first component is removed from second regions.

15. The method as claimed in claim 14, further comprising determining a volume fraction of the second component of the block copolymer so that the second component covers the second regions of the image layer.

16. The method as claimed in claim 15, wherein the second component covers at least two portions of the second region of the image layer and exposes a third portion of the second region between the at least two portions.

17. The method as claimed in claim 16, wherein each of the at least two portions has a size corresponding to a size of a feature to be formed on the substrate between the first regions.

18. The method as claimed in claim 16, wherein arranging the block copolymer comprises arranging the block copolymer such that the first component is on the first regions and on the third portion of the second region, and the second component is on the at least two portions of the second region.

19. The method as claimed in claim 14, wherein determining the volume fraction of the first component includes determining a width of a pattern formed by microphase separation of the block copolymer.

20. The method as claimed in claim 14, wherein the block copolymer is a diblock copolymer.

* * * * *